(12) United States Patent
Kotani et al.

(10) Patent No.: US 9,548,365 B2
(45) Date of Patent: Jan. 17, 2017

(54) SEMICONDUCTOR DEVICE AND METHOD FOR MANUFACTURING SEMICONDUCTOR DEVICE

(71) Applicant: FUJITSU LIMITED, Kawasaki-shi, Kanagawa (JP)

(72) Inventors: Junji Kotani, Atsugi (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/922,524

(22) Filed: Oct. 26, 2015

(65) Prior Publication Data

US 2016/0172478 A1    Jun. 16, 2016

(30) Foreign Application Priority Data

Dec. 11, 2014    (JP) .................. 2014-250794

(51) Int. Cl.
*H01L 29/20* (2006.01)
*H01L 29/207* (2006.01)
*H01L 29/66* (2006.01)
*H01L 29/778* (2006.01)

(52) U.S. Cl.
CPC ....... *H01L 29/207* (2013.01); *H01L 29/66462* (2013.01); *H01L 29/7786* (2013.01); *H01L 29/2003* (2013.01)

(58) Field of Classification Search
CPC ........... H01L 29/7787; H01L 29/66431; H01L 29/205; H01L 29/207; H01L 29/1033
See application file for complete search history.

(56) References Cited

U.S. PATENT DOCUMENTS

2015/0041825 A1\* 2/2015 Liu ................... H01L 29/66462
257/77
2015/0243736 A1\* 8/2015 Kaneda ............. H01L 21/02576
257/76

\* cited by examiner

*Primary Examiner* — Roy Potter
*Assistant Examiner* — Paul Patton
(74) *Attorney, Agent, or Firm* — Kratz, Quintos & Hanson, LLP

(57) ABSTRACT

A semiconductor device includes: a buffer layer formed over a substrate; a first semiconductor layer formed over the buffer layer by using a compound semiconductor; a second semiconductor layer formed over the first semiconductor layer by using a compound semiconductor; and a gate electrode, a source electrode, and a drain electrode formed over the second semiconductor layer, wherein the first semiconductor layer contains an impurity element serving as an acceptor and an impurity element serving as a donor; and in the first semiconductor layer, an acceptor concentration of the impurity element serving as the acceptor is greater than a donor concentration of the impurity element serving as the donor; and the donor concentration is greater-than over equal to $5 \times 10^{16}$ cm$^{-3}$.

18 Claims, 17 Drawing Sheets

C CONCENTRATION

C,Si CONCENTRATION

C,Si
CONCENTRATION

C,Si CONCENTRATION

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2014-250794, filed on Dec. 11, 2014, the entire contents of which are incorporated herein by reference.

FIELD

The embodiments discussed herein are related to a semiconductor device and a method for manufacturing a semiconductor device.

BACKGROUND

Nitride semiconductors are investigated with respect to application to semiconductor devices with high withstand voltage and high output by using their characteristics such as high saturation electron speeds, wide band gaps, etc. For example, nitride semiconductor GaN has a band gap of 3.4 eV larger than the band gap (1.1 eV) of Si and the band gap (1.4 eV) of GaAs and has high breakdown electric field strength. Therefore, nitride semiconductors such as GaN and the like are very promising as semiconductor device materials for power supplies from which high-voltage operation and high output are obtained.

There are many reports on field effect transistors, particularly high electron mobility transistors (HEMT), as semiconductor devices using nitride semiconductors. For example, AlGaN/GaN HEMT using GaN as an electron travelling layer and AlGaN as an electron supply layer attracts attention as GaN-based HEMT (GaN-HEMT). The AlGaN/GaN HEMT causes distortion in AlGaN due to a lattice constant difference between GaN and AlGaN. High-concentration 2DEG (Two-Dimensional Electron Gas) is produced by a difference between the resulting piezoelectric polarization and spontaneous polarization of AlGaN. Therefore, the GaN-HEMT is expected as a high-efficiency switch element and a high-withstand-voltage power device for electric cars and the like. In addition, from the viewpoint of circuit design and safety, the realization of nitride semiconductor transistors having normally-off characteristics is desired.

The above-described semiconductor devices using compounds semiconductors such as nitride semiconductors are desired to have low on-resistance during transistor operation.

The followings are reference documents.
[Document 1] Japanese Laid-open Patent Publication No. 2012-151422,
[Document 2] Japanese Laid-open Patent Publication No. 2012-9630 and
[Document 3] Japanese Laid-open Patent Publication No. 2008-124373.

SUMMARY

According to an aspect of the invention, a semiconductor device includes: a buffer layer formed over a substrate; a first semiconductor layer formed over the buffer layer by using a compound semiconductor; a second semiconductor layer formed over the first semiconductor layer by using a compound semiconductor; and a gate electrode, a source electrode, and a drain electrode formed over the second semiconductor layer, wherein the first semiconductor layer contains an impurity element serving as an acceptor and an impurity element serving as a donor; and in the first semiconductor layer, an acceptor concentration of the impurity element serving as the acceptor is greater than a donor concentration of the impurity element serving as the donor; and the donor concentration is greater-than over equal to $5 \times 10^{16}$ cm$^{-3}$.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
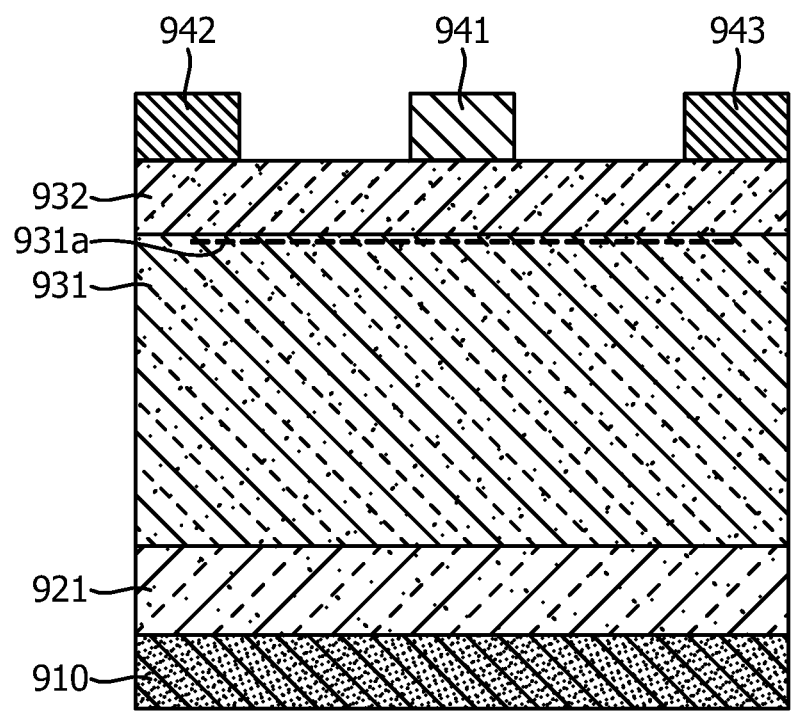
FIGS. 1A and 1B are structural drawings of a semiconductor device including a nitride semiconductor layer containing C.

Hereinafter, embodiments are described. The same members are denoted by the same reference numerals and duplicated description is omitted.

[First Embodiment]

Figure 1B:
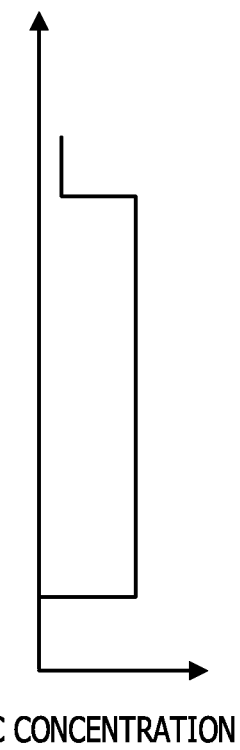

First, a field effect transistor using a nitride semiconductor is described as a semiconductor device using a nitride semiconductor based on FIGS. 1A and 1B. A field effect transistor having a structure illustrated in FIG. 1A includes a nucleation layer (not illustrated), a buffer layer 921, an electron transit layer 931, and an electron supply layer 932 that are formed on a silicon substrate 910. Further, a gate electrode 941, a source electrode 942, and a drain electrode 943 are formed on the electron supply layer 932.

A Si(111) substrate is used as the silicon substrate 910. The nucleation layer is made of AlN or the like. The buffer layer 921 is also referred to as a "curvature control buffer layer" and includes an AlGaN film having a thickness of 750 nm. The electron transit layer 931 includes a GaN film having a thickness of about 1.3 μm, and the electron supply layer 932 includes an AlGaN film having a thickness of about 20 nm. Therefore, 2DEG 931a is produced in the electron transit layer 931 near the interface between the electron transit layer 931 and the electron supply layer 932.

The electron transit layer 931 may include two GaN layers, and the side where the buffer layer 921 is formed may be referred to as a "GaN buffer layer, and the side where the electron supply layer 932 is formed may be referred to as a "GaN channel layer. In this case, the GaN buffer layer is formed for forming the GaN channel layer with high crystallinity, and the GaN channel layer functions as an original electron transit layer. For example, the GaN buffer layer is formed to have a thickness of 1 μm, and the GaN channel layer is formed to have a thickness of 300 nm.

The nitride semiconductor films of the nucleation layer (not illustrated), the buffer layer 921, the electron transit layer 931, and the electron supply layer 932 are formed by epitaxial growth such as MOCVD (Metal Organic Chemical Vapor Deposition) or the like. A nitride semiconductor film contains large amounts of impurity elements such as C (carbon) when formed at a high deposition rate, but the concentration of C contained in the film may be decreased by decreasing the deposition rate. However, when the electron transit layer 931 is formed under the condition of a high deposition rate, the concentration of C contained in the electron transit layer 931 or the buffer layer 921 is increased. FIG. 1B illustrates a concentration distribution of C contained in the nitride semiconductor layers.

Figure 2:
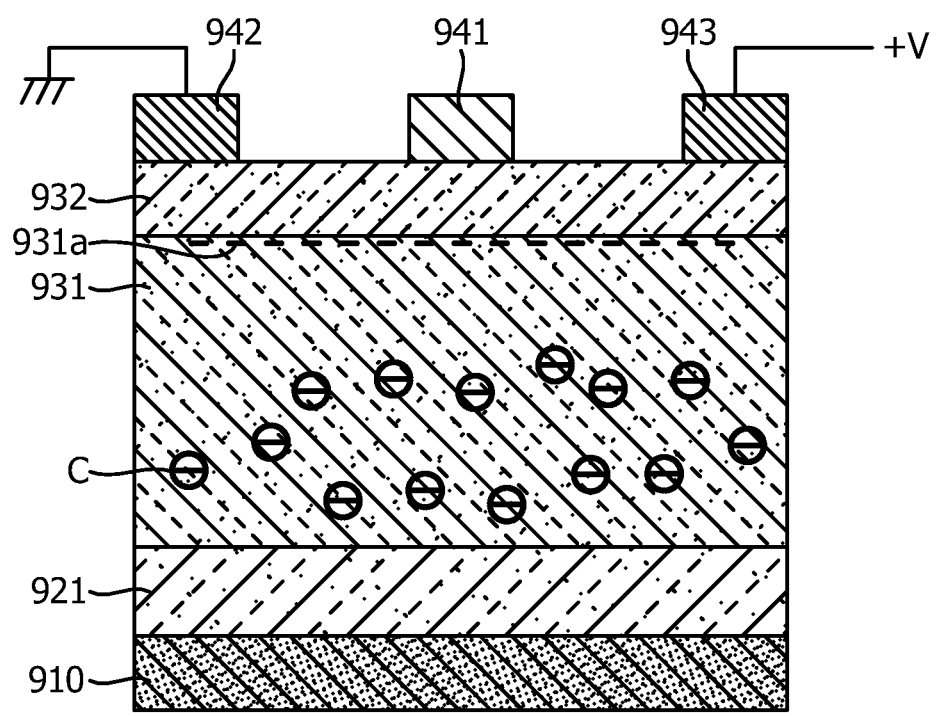
FIG. 2 is an explanatory drawing of a semiconductor device including a nitride semiconductor layer containing C.

However, C is an impurity element serving as an acceptor in GaN or the like, and thus when the electron transit layer 931 contains a large amount of C, the characteristics of the semiconductor device may be adversely affected. Specifically, when a voltage is applied between the source electrode 942 and the drain electrode 943 during transistor operation, electrons are trapped by C contained in the electron transit layer 931 as illustrated in FIG. 2. When electrons are trapped by C contained in the electron transit layer 931, the electron transit layer 931 is negatively charged, and thus 2DEG 931a is decreased, thereby decreasing a drain current and increasing ON resistance. Thus, current collapse occurs.

Therefore, in order to decrease the C concentration in the GaN channel layer in which a channel that influences electric characteristics is formed in the electron transit layer 931, a conceivable method is to deposit the layer under the condition of a low deposition rate. However, in this case, the manufacturing throughput of a semiconductor device is decreased.

(Semiconductor Device)

Figure 3A:
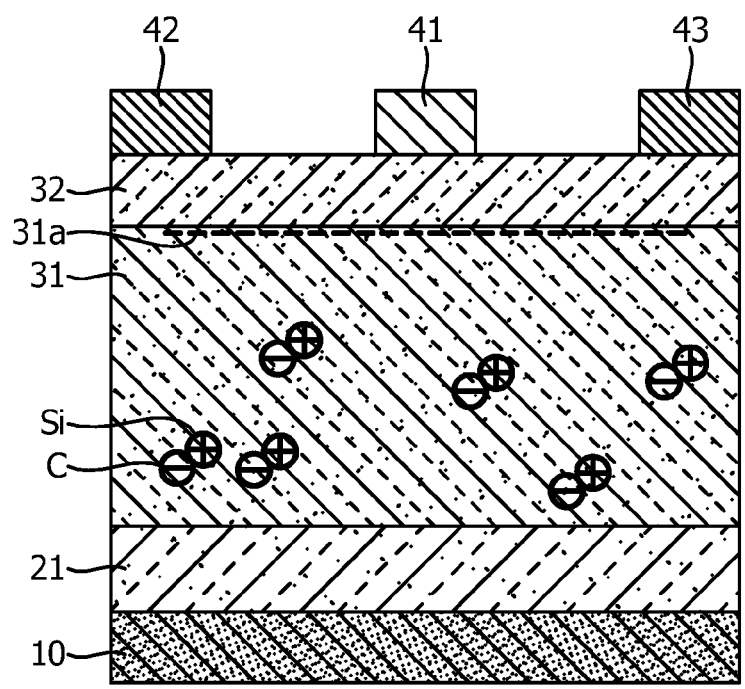
FIGS. 3A and 3B are structural drawings of a semiconductor device according to a first embodiment.

Next, a semiconductor device according to this embodiment is described. As illustrated in FIG. 3A, a semiconductor device according to this embodiment includes a nucleation layer (not illustrated), a buffer layer 21, an electron transit layer 31, and an electron supply layer 32 which are formed on a silicon substrate 10. Further, a gate electrode 41, a source electrode 42, and a drain electrode 43 are formed on the electron supply layer 32. A Si(111) substrate is used as the silicon substrate 10. The nucleation layer is made of AlN or the like and has a thickness of about 150 nm.

The buffer layer 21 is also referred to as a "curvature control buffer layer" and formed by stacking a plurality of AlGaN films having different composition ratios. Specifically, the buffer layer 21 is formed by stacking in order an $Al_{0.8}Ga_{0.2}N$ film having a thickness of 200 nm, an $Al_{0.5}Ga_{0.5}N$ film having a thickness of 250 nm, and an $Al_{0.2}Ga_{0.8}N$ film having a thickness of 300 nm. The electron transit layer 31 includes a GaN film having a thickness of about 1.3 μm, and the electron supply layer 32 includes an $Al_{0.2}Ga_{0.8}N$ film having a thickness of about 20 nm. Therefore, 2DEG 31a is produced in the electron transit layer 31 near the interface between the electron transit layer 31 and the electron supply layer 32.

The nitride semiconductor films of the nucleation layer (not illustrated), the buffer layer 21, the electron transit layer 31, and the electron supply layer 32 may be formed by epitaxial deposition such as MBE (Molecular Beam Epitaxy) or MOCVD. In the embodiment, the nitride semiconductor layers are formed by MOCVD epitaxial growth.

In the embodiment, the buffer layer 21 and the electron transit layer 31 are deposited under the condition of a high deposition rate, and thus the buffer layer 21 and the electron transit layer 31 contain C as an impurity element.

Figure 3B:
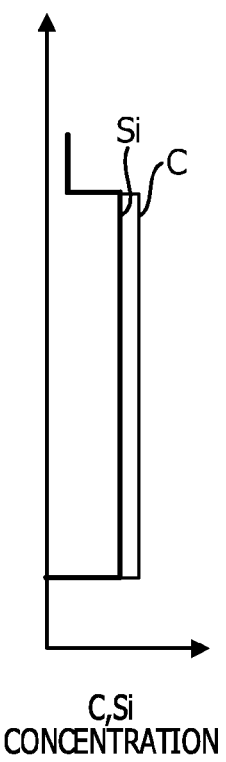
Figure 4A:
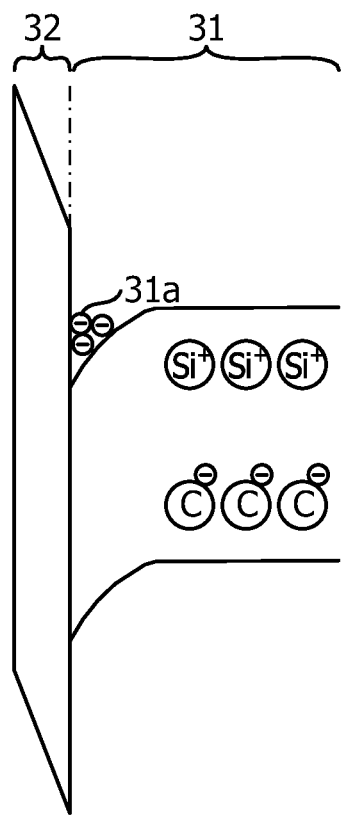
FIGS. 4A and 4B are explanatory drawings of a band structure of a semiconductor device according to a first embodiment.
Figure 4B:
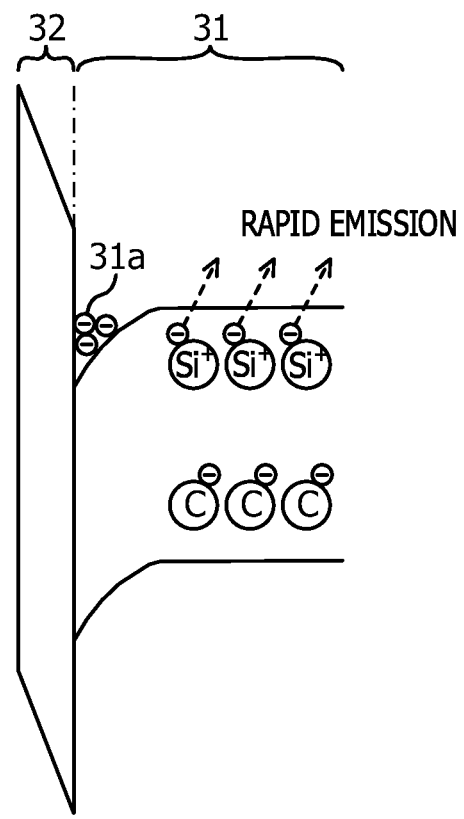

In the semiconductor device according to the embodiment, the buffer layer 21 and the electron transit layer 31 which contain C are doped with Si. FIG. 3B illustrates concentration distributions of C and Si contained in the nitride semiconductor layers according to the embodiment. Therefore, when the buffer layer 21 and the electron transit layer 31 are doped with Si, in a thermal equilibrium state in which a voltage is not applied, electrons emitted from dopant Si are trapped by C as illustrated in FIG. 4A. Therefore, during a transistor operation with a voltage applied, electrons are not trapped C anymore because electrons have already been trapped by C, and thus the supplied electrons are partially trapped by Si as illustrated in FIG. 4B. However, the electrons trapped by Si are emitted within a short time because of the short electron emission time constant of Si as compared with C. Thus, the occurrence of current collapse may be suppressed, and an increase in ON resistance may be suppressed.

Specifically, a difference (activation energy) between the lower end of a conduction band of GaN and the position of the electronic level of Si as an impurity element is 0.02 eV, and a difference between the lower end of a conduction band of GaN and the position of the electronic level of C as an impurity element is 0.7 eV. Therefore, based on FIG. 6 described below, the electron emission time constant of Si is about 10 to 11 digits lower than that of C, and even when electrons are trapped by Si, the electrons are emitted within a short time.

Figure 5:
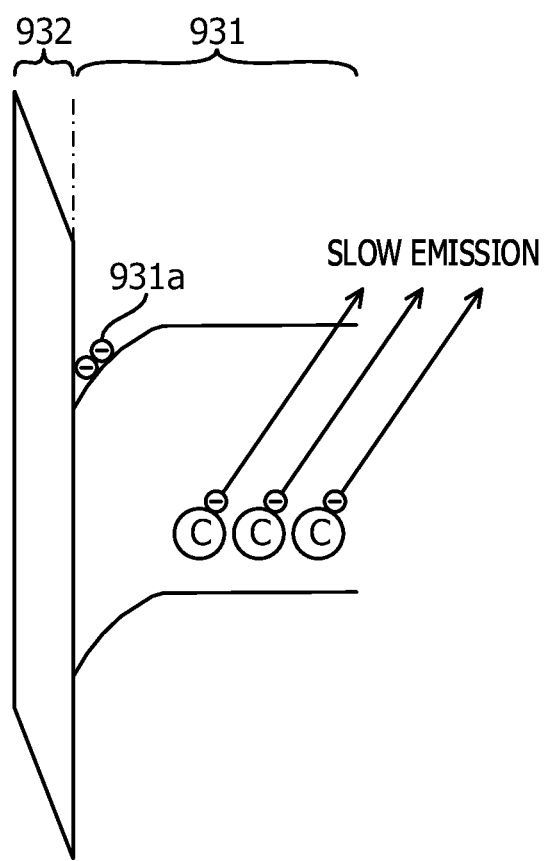
FIG. 5 is an explanatory drawing of a band structure of a semiconductor device including a nitride semiconductor layer containing C.

On the other hand, in the semiconductor device having a structure illustrated in FIGS. 1A and 1B, the electron transit layer 931 contains a large amount of C but is not doped with Si. Thus, as illustrated in FIG. 5, electrons are trapped by C contained in the electron transit layer 931 during transistor operation. The electrons trapped by C remain in a trapped state for a long time because of the long electron emission time constant of C, thereby decreasing 2DEG 931a and generating current collapse during the state.

Therefore, in the semiconductor device according to the embodiment, the electron transit layer 31 containing a large amount of C is doped with Si, and thus electrons emitted from dopant Si are trapped by C as illustrated by FIG. 4A. Therefore, when a voltage is applied to perform a transistor operation, as illustrated in FIG. 4B, electrons are trapped by Si having a short electron emission time constant, not are trapped by C. Since the electrons trapped by Si are emitted within a short time, the influence on 2DEG is small, and the occurrence of current collapse is suppressed.

Figure 6:
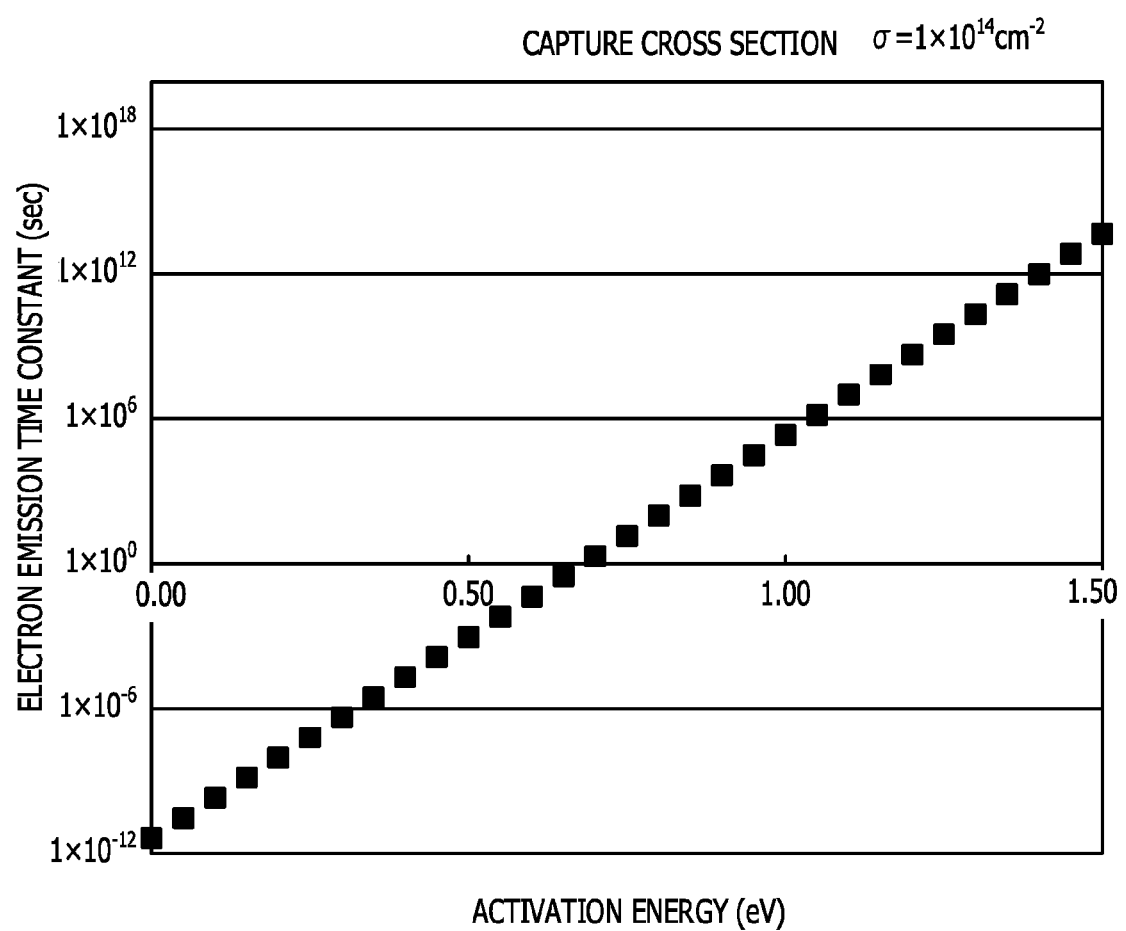
FIG. 6 is a correlation diagram between activation energy and electron emission time constant.

FIG. 6 illustrates a relation between the activation energy and electron emission time constant with a capture cross section of $1 \times 10^{-14}$ cm$^{-2}$. According to FIG. 6, any impurity element having a difference (activation energy) of 0.3 eV or less between the lower end of a conduction band of GaN and the position of the electronic level of an impurity element has an electron emission time constant about 6 or more digits lower than that of C. Therefore, it is considered that doping GaN with such an impurity element may effectively suppress the occurrence of current collapse.

Figure 7:
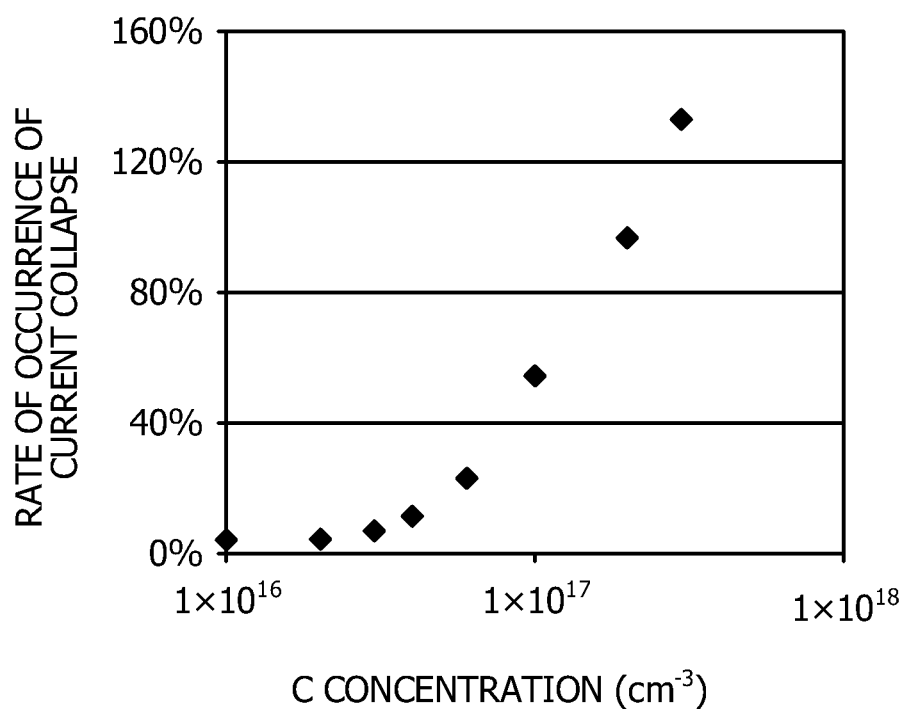
FIG. 7 is a correlation diagram between the concentration of C contained in GaN and the rate of occurrence of current collapse.

Next, the current collapse and the concentration of an impurity element are described. FIG. 7 illustrates a relation between the rate of occurrence of current collapse and the concentration of C contained in a GaN layer of an electron transit layer. The rate of occurrence of current collapse is a value obtained by a formula below wherein Idb represents a drain current flowing when a voltage is first applied before electrons are captured, and Ida represents a drain current flowing when a voltage is again applied after electrons are captured by applying a voltage.

Rate of occurrence of current collapse= $\{(Idb-Ida)/Ida\} \times 100$

FIG. 7 indicates that when the doping concentration of C is $5 \times 10^{16}$ cm$^{-3}$ or more, the rate of occurrence of current collapse is rapidly increased. That is, with an impurity doping concentration of less than $5 \times 10^{16}$ cm$^{-3}$, substantially no current collapse occurs, while with an impurity doping concentration of $5 \times 10^{16}$ cm$^{-3}$ or more, current collapse occurs. Therefore, it is considered that the impurity concentration influencing a current collapse phenomenon is $5 \times 10^{16}$ cm$^{-3}$ or more.

Figure 8:
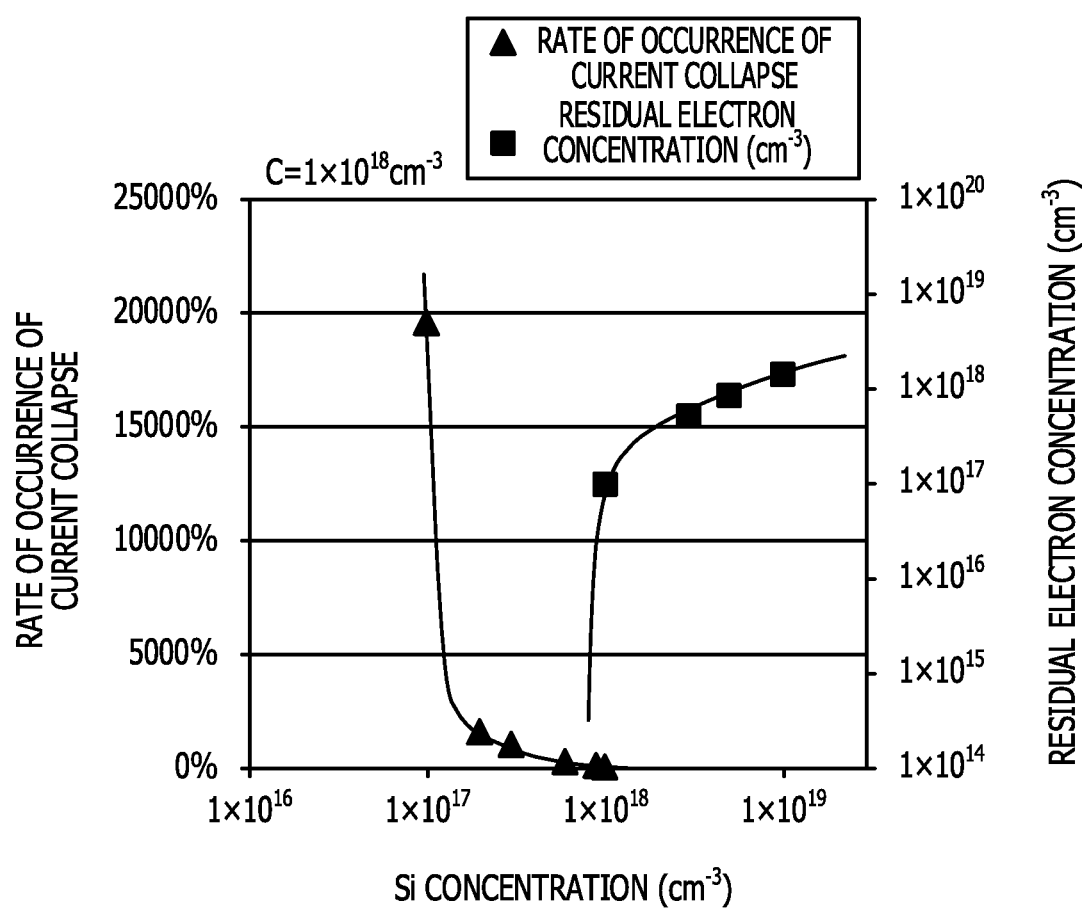
FIG. 8 is a correlation diagram (1) between the concentration of Si contained in C-containing GaN and the rate of occurrence of current collapse.

FIG. 8 illustrates relations of the Si doping concentration to the residual electron concentration and the rate of occurrence of current collapse when the concentration of C contained in the electron transit layer 31 is $1 \times 10^{18}$ cm$^{-3}$. FIG. 8 indicates that when the Si concentration is higher than the C concentration of $1 \times 10^{18}$ cm$^{-3}$, the residual electron concentration is rapidly increased. When the residual electron concentration is increased, the OFF performance of a transistor is degraded, and thus even when the current collapse may be suppressed, the electron transit layer 31 is not desired as an electron transit layer. In addition, when the Si concentration is $2 \times 10^{17}$ cm$^{-3}$ or more that is ⅕ of the C concentration or more, the rate of occurrence of current collapse is rapidly decreased.

Figure 9:
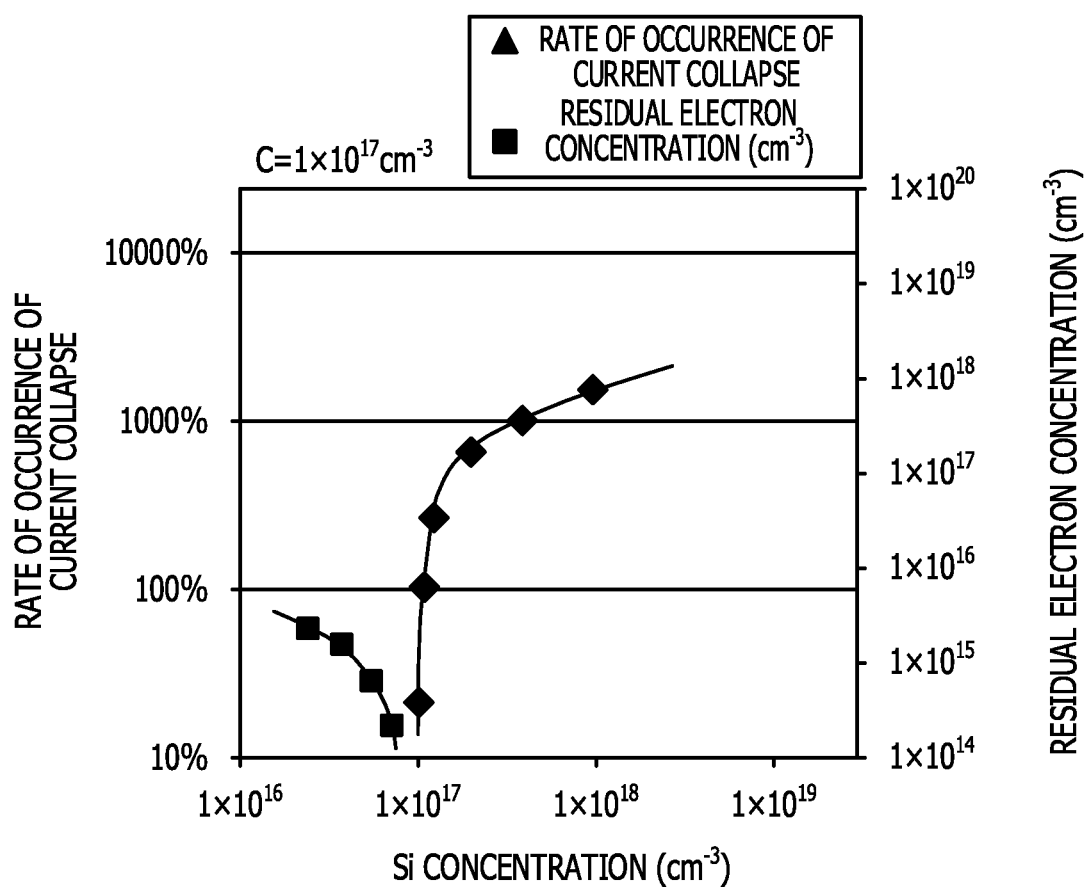
FIG. 9 is a correlation diagram (2) between the concentration of Si contained in C-containing GaN and the rate of occurrence of current collapse.

FIG. 9 illustrates relations of the Si doping concentration to the residual electron concentration and the rate of occurrence of current collapse when the concentration of C contained in the electron transit layer 31 is $1 \times 10^{17}$ cm$^{-3}$. In this case, similarly, when the Si concentration is higher than the C concentration of $1 \times 10^{17}$ cm$^{-3}$, the residual electron density is rapidly increased. Therefore, the concentration of Si or the like which is doped as a donor is preferably less than the concentration of C or the like which is doped as an acceptor.

Therefore, in the embodiment, the donor concentration of Si or the like (concentration of an impurity element serving as a donor) contained in the electron transit layer 31 is preferably less than the acceptor concentration of C or the like (concentration of an impurity element serving as an acceptor). That is, it is preferred that the donor concentration<the acceptor concentration. In addition, the donor concentration of Si or the like contained in the electron transit layer 31 is preferably $5 \times 10^{16}$ cm$^{-3}$ or more. That is, it is preferred that the donor concentration≥$5 \times 10^{16}$ cm$^{-3}$. It is further preferred that the donor concentration is ⅕ of the acceptor concentration or more, that is, the acceptor concentration/5 ≤the donor concentration. In addition, Fe (iron) or the like other than C may be used as an impurity element serving as an acceptor in GaN, and O (oxygen) or the like other than Si may be used as an impurity element serving as a donor.

In the semiconductor device according to the embodiment, only the electron transit layer 31 containing C may be doped with Si, or the electron transit layer 31 and the buffer layer 21 which contain C may be doped with Si.

(Method for Manufacturing Semiconductor Device)

Next, a method for manufacturing the semiconductor device according to the embodiment is described. The method for manufacturing the semiconductor device according to the embodiment includes forming the nitride semiconductor layers on the silicon substrate 10 used as a substrate by epitaxial growth. In description of the embodiment, the formation of the nitride semiconductor layers by MOCVD is described. When the nitride semiconductor layers are formed by MOCVD, TMA (trimethyl aluminum) is used as an Al raw material gas, TMG (trimethyl gallium) is used as a Ga raw material gas, and NH$_3$ (ammonia) is used as a N raw material gas. In addition, SiH$_4$ is used as a raw material gas for Si doping.

As illustrated in FIGS. 3A and 3B, first, the nucleation layer (not illustrated), the buffer layer 21, the electron transit layer 31, and the electron supply layer 32 are formed in order on the silicon substrate 10 by using nitride semiconductors. Although, in the embodiment, a silicon (111) substrate is used as the silicon substrate 10, a substrate made of SiC sapphire, GaN, or the like may be used in place of the silicon substrate 10.

The nucleation layer (not illustrated) includes an AlN film having a thickness of 150 nm. Specifically, the nucleation layer (not illustrated) is formed by growth under conditions in which the substrate temperature is about 1000° C., the V/III ratio is 1000 to 2000, and the pressure in a chamber of a MOCVD apparatus is about 50 mbar.

The buffer layer 21 is formed by growing an AlGaN film under conditions in which the substrate temperature is about 1000° C., the V/III ratio is 100 to 600, and the pressure in a chamber of a MOCVD apparatus is about 50 mbar. The buffer layer 21 is formed by, for example, stacking three AlGaN films having different composition ratios. Specifically, an Al$_{0.8}$Ga$_{0.2}$N film having a thickness of about 200 nm, an Al$_{0.5}$Ga$_{0.5}$N film having a thickness of about 250 nm, and an Al$_{0.2}$Ga$_{0.8}$N film having a thickness of about 300 nm are stacking in order by adjusting the amounts of TMA and TMG supplied. The C concentration in the buffer layer 21 formed under these conditions is about $3 \times 10^{17}$ cm$^{-3}$. When the buffer layer 21 is formed in the embodiment, about 100 ppm of SiH$_4$ is supplied at about 15 sccm to the chamber of the MOCVD apparatus. As a result, the buffer layer 21 is doped with Si at a concentration of about $2 \times 10^{17}$ cm$^{-3}$.

The electron transit layer 31 is formed by growing a GaN film having a thickness of about 1.3 μm under conditions in which the substrate temperature is about 1000° C., the V/III ratio is 100 or less, and the pressure in a chamber of a MOCVD apparatus is about 100 mbar. The C concentration in the electron transit layer 31 formed under these conditions is about $3\times10^{17}$ cm$^{-3}$. When the electron transit layer 31 is formed in the embodiment, about 100 ppm of SiH$_4$ is supplied at about 15 sccm to the chamber of the MOCVD apparatus. As a result, the electron transit layer 31 is doped with Si at a concentration of about $2\times10^{17}$ cm$^{-3}$.

Figure 10:
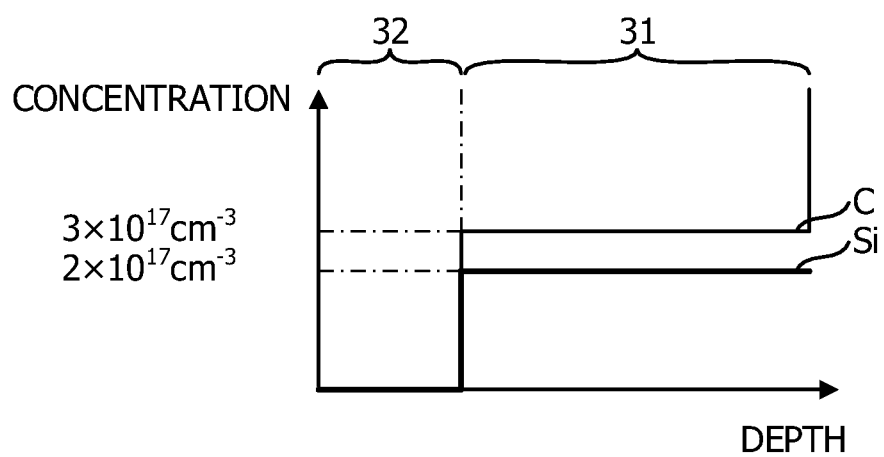
FIG. 10 is a concentration distribution diagram of C and Si contained in a semiconductor device according to a first embodiment.

The electron supply layer 32 is formed by growing an Al$_{0.8}$Ga$_{0.2}$N film having a thickness of about 20 nm under conditions in which the substrate temperature is about 1000° C., the V/III ratio is 400 to 600, and the pressure in a chamber of a MOCVD apparatus is about 50 mbar. When the electron supply layer 32 is formed, SiH$_4$ is not supplied to the chamber of the MOCVD apparatus. FIG. 10 illustrates a relation between the depth and C and Si concentrations in the nitride semiconductor layers of the semiconductor device according to the embodiment.

Next, the source electrode 42 and the drain electrode 43 are formed on the electron supply layer 32. Specifically, a photoresist is applied to the electron supply layer 32, exposed by an exposure device, and developed to form a resist pattern (not illustrated) having an aperture in a region where each of the source electrode 42 and the drain electrode 43 is to be formed. Then, a metal laminated film of Ti (thickness: 100 nm)/Al (thickness: 300 nm) is deposited by vacuum vapor deposition or the like, and then the metal laminated film deposited on the resist pattern (not illustrated) is lifted off by immersing in an organic solvent or the like. Consequently, the source electrode 42 and the drain electrode 43 are formed by the remaining Ti/Al metal laminated film. Then, RTA (rapid thermal annealing) is performed at a temperature of 600° C. to make ohmic contact.

Next, the gate electrode 41 is formed on the electron supply layer 32. Specifically, a photoresist is applied to the electron supply layer 32, exposed by an exposure device, and developed to form a resist pattern (not illustrated) having an aperture in a region where the gate electrode 41 is to be formed. Then, a metal laminated film of Ni (thickness: 50 nm)/Au (thickness: 300 nm) is deposited by vacuum vapor deposition or the like, and then the metal laminated film deposited on the resist pattern (not illustrated) is lifted off by immersing in an organic solvent or the like. Consequently, the gate electrode 41 is formed by the remaining Ni/Au metal laminated film.

Although, in the embodiment, the semiconductor device formed by using the nitride semiconductors such as GaN, AlGaN, and the like is described, the semiconductor device according to the embodiment may be formed by using compound semiconductors such as GaAs, AlGaAs, and the like.

[Second Embodiment]

Figure 11:
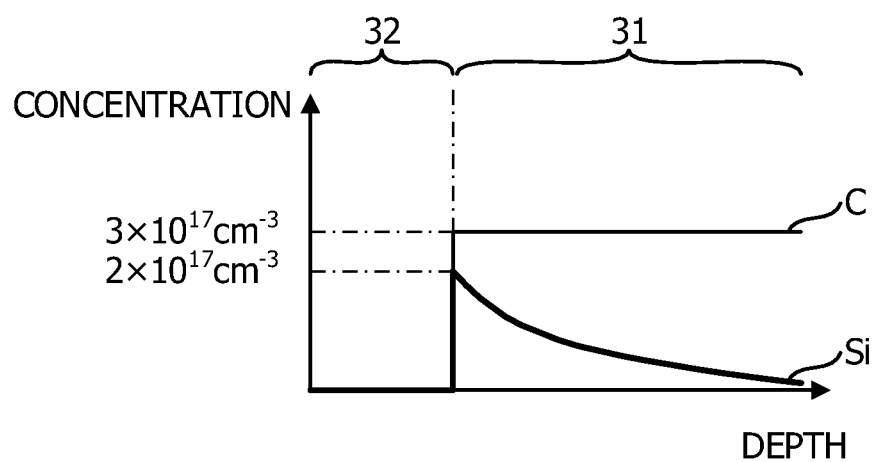
FIG. 11 is a concentration distribution diagram of C and Si contained in a semiconductor device according to a second embodiment.

Next, a second embodiment is described. In the second embodiment, as illustrated in FIG. 11, Si doping in an electron transit layer 31 is performed so that the Si doping concentration is highest near the interface between an electron supply layer 32 and an electron transit layer 31 and is gradually decreased with increasing distance and depth from the interface. The influence of C on current collapse gradually weakens with increasing distance from the interface between the electron supply layer 32 and the electron transit layer 31. Therefore, doping is performed so that the Si concentration is highest near the interface between the electron supply layer 32 and the electron transit layer 31 and is gradually decreased with increasing distance and depth from the interface. This effectively suppresses the occurrence of a current collapse phenomenon by a proper amount of Si doping. In the embodiment, doping is performed so that the Si concentration near the interface between the electron supply layer 32 and the electron transit layer 31 is about $2\times10^{17}$ cm$^{-3}$.

In order to form the electron transit layer 31 doped so that the Si concentration is gradually decreased, the electron transit layer 31 is formed while an amount of SiH$_4$ supplied to a chamber of a MOCVD apparatus is gradually increased. In addition, when the electron supply layer 32 is formed, the supply of SiH$_4$ to the chamber of the MOCVD apparatus is stopped. In the embodiment, doping may be performed so that the Si concentration is gradually decreased as illustrated in FIG. 11 or step wisely decreased with increasing distance from the interface between the electron supply layer 32 and the electron transit layer 31.

The second embodiment is the same as the first embodiment except for the contents described above.

[Third Embodiment]

Figure 12:
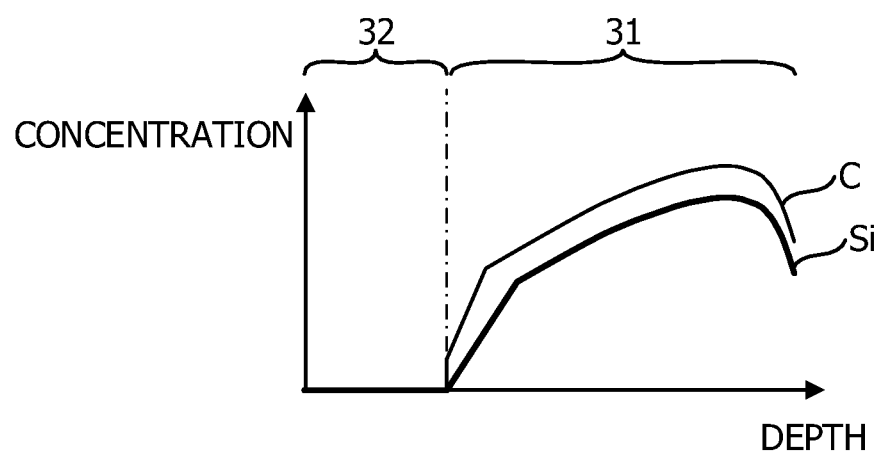
FIG. 12 is a concentration distribution diagram of C and Si contained in a semiconductor device according to a third embodiment.

Next, a third embodiment is described. In the third embodiment, as illustrated in FIG. 12, when a C doping concentration in an electron transit layer 31 has a concentration distribution in the depth direction, a Si doping concentration also has a concentration distribution in the depth direction corresponding to the C concentration. In order to form the electron transit layer 31 doped so that the Si concentration has a concentration distribution in the depth direction, the electron transit layer 31 is formed while an amount of SiH$_4$ supplied to a chamber of a MOCVD apparatus is changed according to changes in the concentration of C contained in the electron transit layer 31.

The third embodiment is the same as the first embodiment except for the contents described above.

[Fourth Embodiment]

Figure 13A:
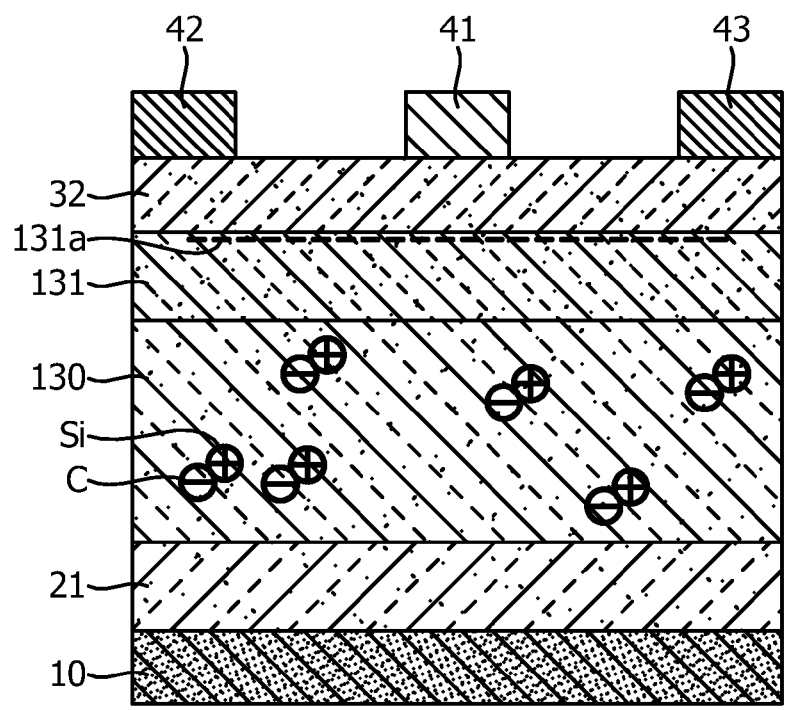
FIGS. 13A and 13B are structural drawings of a semiconductor device according to a fourth embodiment.

Next, a fourth embodiment is described. A semiconductor device according to the fourth embodiment has a structure including a GaN buffer layer. Specifically, as illustrated in FIG. 13A, the semiconductor device according to the embodiment includes a nucleation layer (not illustrated), a buffer layer 21, a GaN buffer layer 130, an electron transit layer 131, and an electron supply layer 32 which are formed on a silicon substrate 10. In the embodiment, the GaN buffer layer 130 includes a GaN film having a thickness of about 1 µm, and the electron transit layer 131 includes a GaN film having a thickness of about 300 nm. Consequently, 2DEG 131*a* is produced in the electron transit layer 131 near the interface between the electron transit layer 131 and the electron supply layer 32. The combination of the GaN buffer layer 130 that is a semiconductor buffer layer and the electron transit layer 131 may be referred to as an "electron transit layer".

Figure 13B:
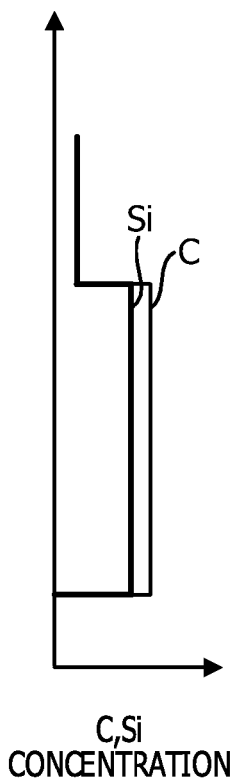

In the embodiment, like the electron transit layer 31 of the first embodiment, the GaN buffer layer 130 is formed under the condition of a high deposition rate, contains C, and is thus doped with Si. On the other hand, the electron transit layer 131 is formed under the condition of a low deposition rate so as to contain substantially no C and is thus not doped with Si. FIG. 13B illustrates concentration distributions of C and Si contained in the semiconductor layers according to the embodiment.

A method for manufacturing the semiconductor device according to the embodiment includes forming in order the GaN buffer layer 130 described below and the electron transit layer 131 on the buffer layer 21, and forming the electron supply layer 32 on the electron transit layer 131. The method for manufacturing the semiconductor device according to the embodiment is the same as the method for manufacturing the semiconductor device according to the first embodiment except for the step of forming the GaN buffer layer 130 and the electron transit layer 131.

The GaN buffer layer 130 is formed by growing a GaN film having a thickness of about 1 μm under conditions in which the substrate temperature is about 1000° C., the V/III ratio is 100 or less, and the pressure in a chamber of a MOCVD apparatus is about 100 mbar. The C concentration in the GaN buffer layer 130 formed under these conditions is about $3\times10^{17}$ cm$^{-3}$. Therefore, when the GaN buffer layer 130 is formed in the embodiment, about 100 ppm of SiH$_4$ is supplied at about 15 sccm to a chamber of a MOCVD apparatus. As a result, the GaN buffer layer 130 is doped with Si at a concentration of about $2\times10^{17}$ cm$^{-3}$.

The electron transit layer 131 is formed by growing a GaN film having a thickness of about 300 nm under conditions in which the substrate temperature is about 1000° C., the V/III ratio is 3000 or more, and the pressure in a chamber of a MOCVD apparatus is about 200 mbar. The C concentration in the electron transit layer 131 formed under these conditions is as very low as about $5\times10^{16}$ cm$^{-3}$ or less. That is, the electron transit layer 131 is formed under the conditions described above so that the C concentration is very low in order to suppress the current collapse phenomenon, and thus the electron transit layer 131 does not have to be doped with Si. Therefore, in forming the electron transit layer 131, SiH$_4$ is not supplied to the chamber of the MOCVD apparatus.

The fourth embodiment is the same as the first embodiment except for the contents described above.

[Fifth Embodiment]

Next, a fifth embodiment is described. A semiconductor device according to the fifth embodiment uses a SiC substrate in place of a Si substrate. Since SiC and Si have different lattice constants, the first buffer layers formed have different structures.

Figure 14A:
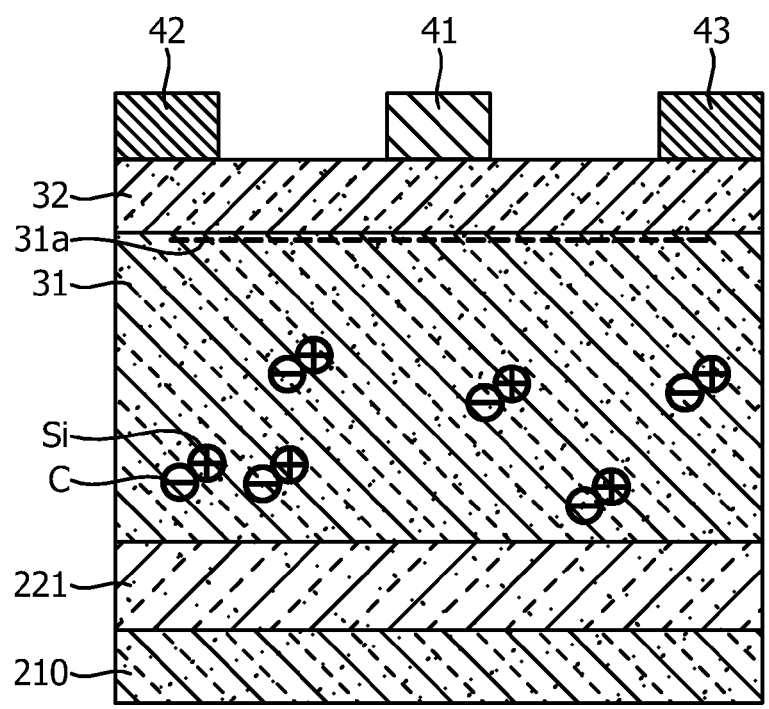
FIGS. 14A and 14B are structural drawings of a semiconductor device according to a fifth embodiment.
Figure 14B:
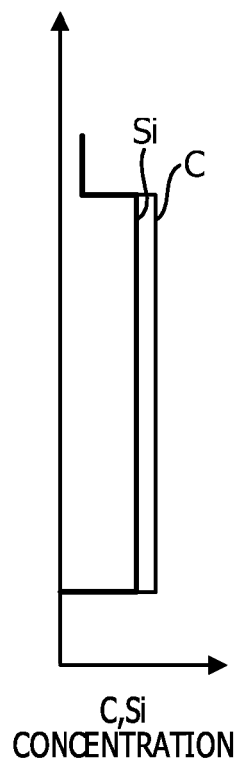

As illustrated in FIG. 14A, the semiconductor device according to the fifth embodiment includes a nucleation layer (not illustrated), a buffer layer 221, a an electron transit layer 31, and an electron supply layer 32 which are formed on a SiC substrate 210. Further, a gate electrode 41, a source electrode 42, and a drain electrode 43 are formed on the electron supply layer 32. FIG. 14B illustrates concentration distributions of C and Si contained in the semiconductor layers according to the embodiment.

The nucleation layer includes an AlN film having a thickness of 30 nm. The buffer layer 221 is also referred to as a "curvature control buffer layer" and includes an Al$_{0.2}$Ga$_{0.8}$N film having a thickness of 200 nm. The electron transit layer 31 includes a GaN film having a thickness of about 1.3 μm, and the electron supply layer 32 includes an Al$_{0.2}$Ga$_{0.8}$N film having a thickness of about 20 nm. Therefore, 2DEG 31a is produced in the electron transit layer 31 near the interface between the electron transit layer 31 and the electron supply layer 32.

(Method for Manufacturing Semiconductor Device)

Next, a method for manufacturing the semiconductor device according to the embodiment is described. The method for manufacturing the semiconductor device according to the embodiment includes forming the nitride semiconductor layers on the silicon substrate 210 used as a substrate by epitaxial growth. In description of the embodiment, the formation of the nitride semiconductor layers by MOCVD is described. When the nitride semiconductor layers are formed by MOCVD, TMA is used as an Al raw material gas, TMG is used as a Ga raw material gas, and NH$_3$ is used as a N raw material gas. In addition, SiH$_4$ is used as a raw material gas for Si doping.

As illustrated in FIGS. 14A and 14B, first, the nucleation layer (not illustrated), the buffer layer 221, the electron transit layer 31, and the electron supply layer 32 are formed in order on the silicon substrate 210 by using nitride semiconductors.

The nucleation layer (not illustrated) includes an AlN film having a thickness of 30 nm. Specifically, the nucleation layer (not illustrated) is formed by growth under conditions in which the substrate temperature is about 1000° C., the V/III ratio is 1000 to 2000, and the pressure in a chamber of a MOCVD apparatus is about 50 mbar.

The buffer layer 221 is formed by growing an AlGaN film under conditions in which the substrate temperature is about 1000° C., the V/III ratio is 100 to 600, and the pressure in a chamber of a MOCVD apparatus is about 50 mbar. The buffer layer 221 includes an Al$_{0.2}$Ga$_{0.8}$N film having a thickness of about 200 nm. The C concentration in the buffer layer 221 formed under these conditions is about $3\times10^{17}$ cm$^{-3}$. When the buffer layer 221 is formed in the embodiment, about 100 ppm of SiH$_4$ is supplied at about 15 sccm to the chamber of the MOCVD apparatus. As a result, the buffer layer 221 is doped with Si at a concentration of about $2\times10^{17}$ cm$^{-3}$.

The electron transit layer 31 is formed by growing a GaN film having a thickness of about 1.3 μm under conditions in which the substrate temperature is about 1000° C., the V/III ratio is 100 or less, and the pressure in a chamber of a MOCVD apparatus is about 100 mbar. The C concentration in the electron transit layer 31 formed under these conditions is about $3\times10^{17}$ cm$^{-3}$. When the electron transit layer 31 is formed in the embodiment, about 100 ppm of SiH$_4$ is supplied at about 15 sccm to the chamber of the MOCVD apparatus. As a result, the electron transit layer 31 is doped with Si at a concentration of about $2\times10^{17}$ cm$^{-3}$.

The electron supply layer 32 is formed by growing an Al$_{0.8}$Ga$_{0.2}$N film having a thickness of about 20 nm under conditions in which the substrate temperature is about 1000° C., the V/III ratio is 400 to 600, and the pressure in a chamber of a MOCVD apparatus is about 50 mbar. When the electron supply layer 32 is formed, SiH$_4$ is not supplied to the chamber of the MOCVD apparatus.

Next, the source electrode 42 and the drain electrode 43 are formed on the electron supply layer 32. Specifically, a photoresist is applied to the electron supply layer 32, exposed by an exposure device, and developed to form a resist pattern (not illustrated) having an aperture in a region where each of the source electrode 42 and the drain electrode 43 is to be formed. Then, a metal laminated film of Ti (thickness: 100 nm)/Al (thickness: 300 nm) is deposited by vacuum vapor deposition or the like, and then the metal laminated film deposited on the resist pattern (not illustrated) is lifted off by immersing in an organic solvent or the like. Consequently, the source electrode 42 and the drain electrode 43 are formed by the remaining Ti/Al metal laminated film. Then, RTA (rapid thermal annealing) is performed at a temperature of 600° C. to make ohmic contact.

Next, the gate electrode 41 is formed on the electron supply layer 32. Specifically, a photoresist is applied to the electron supply layer 32, exposed by an exposure device, and developed to form a resist pattern (not illustrated) having an aperture in a region where the gate electrode 41 is to be formed. Then, a metal laminated film of Ni (thickness: 50 nm)/Au (thickness: 300 nm) is deposited by vacuum vapor deposition or the like, and then the metal laminated film deposited on the resist pattern (not illustrated) is lifted off by immersing in an organic solvent or the like. Consequently, the gate electrode 41 is formed by the remaining Ni/Au metal laminated film.

The fifth embodiment is the same as the first embodiment except for the contents described above.

[Sixth Embodiment]

Next, a sixth embodiment is described. The sixth embodiment relates to a semiconductor device, a power supply device, and a high-frequency amplifier.

Figure 15:
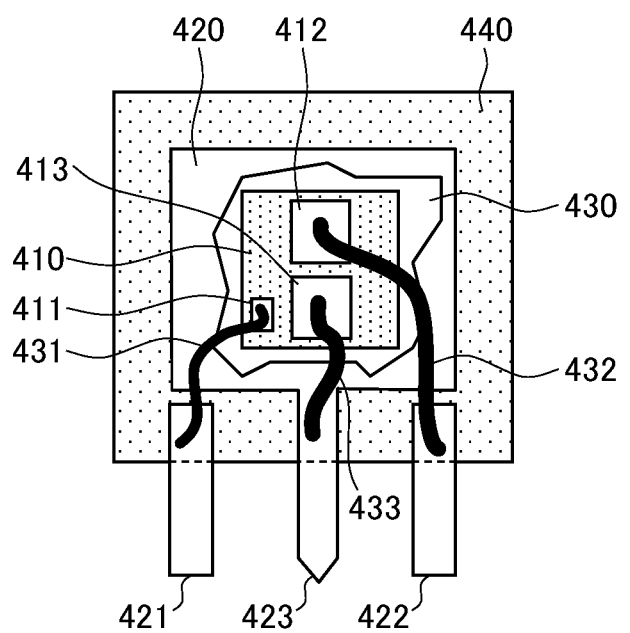
FIG. 15 is an explanatory drawing of a discretely packaged semiconductor device according to a sixth embodiment.

A semiconductor device according to the embodiment is manufactured by discretely packaging the semiconductor device according to any one of the first to fifth embodiments. The discretely packaged semiconductor device is described based on FIG. 15. FIG. 15 schematically illustrates the inside of a discretely packaged semiconductor device which is different in electrode arrangement or the like from the semiconductor devices according to the first to fifth embodiments.

First, the semiconductor device manufactured in any one of the first to fifth embodiments is cut by dicing or the like to form a semiconductor chip 410 that is HEMT using GaN-based semiconductor materials. The semiconductor chip 410 is fixed on a lead frame 420 by a die-attach agent 430 such as solder or the like. The semiconductor chip 410 corresponds to the semiconductor device according to any one of the first to fifth embodiments.

Next, a gate electrode 411 is connected to a gate lead 421 with a bonding wire 431, a source electrode 412 is connected to a source lead 422 with a bonding wire 432, and a drain electrode 413 is connected to a drain lead 423 with a bonding wire 433. The bonding wires 431, 432, and 433 are made of a metal material such as Al or the like. Also, in the embodiment, the gate electrode 411 is a gate electrode pad and is connected to the gate electrode 41 of the semiconductor device according to any one of the first to fifth embodiments. Also, the source electrode 412 is a source electrode pad and is connected to the source electrode 42 of the semiconductor device according to any one of the first to fifth embodiments. Also, the drain electrode 413 is a drain electrode pad and is connected to the drain electrode 43 of the semiconductor device according to any one of the first to fifth embodiments.

Next, resin sealing is performed by a transfer mold method using a mold resin 440. As a result, a discretely packaged semiconductor device that is HEMT using GaN-based semiconductor materials may be manufactured.

Next, a power supply device and a high-frequency amplifier according to the embodiment are described. The power supply device and the high-frequency amplifier according to the embodiment each use the semiconductor device according to any one of the first to fifth embodiments.

Figure 16:
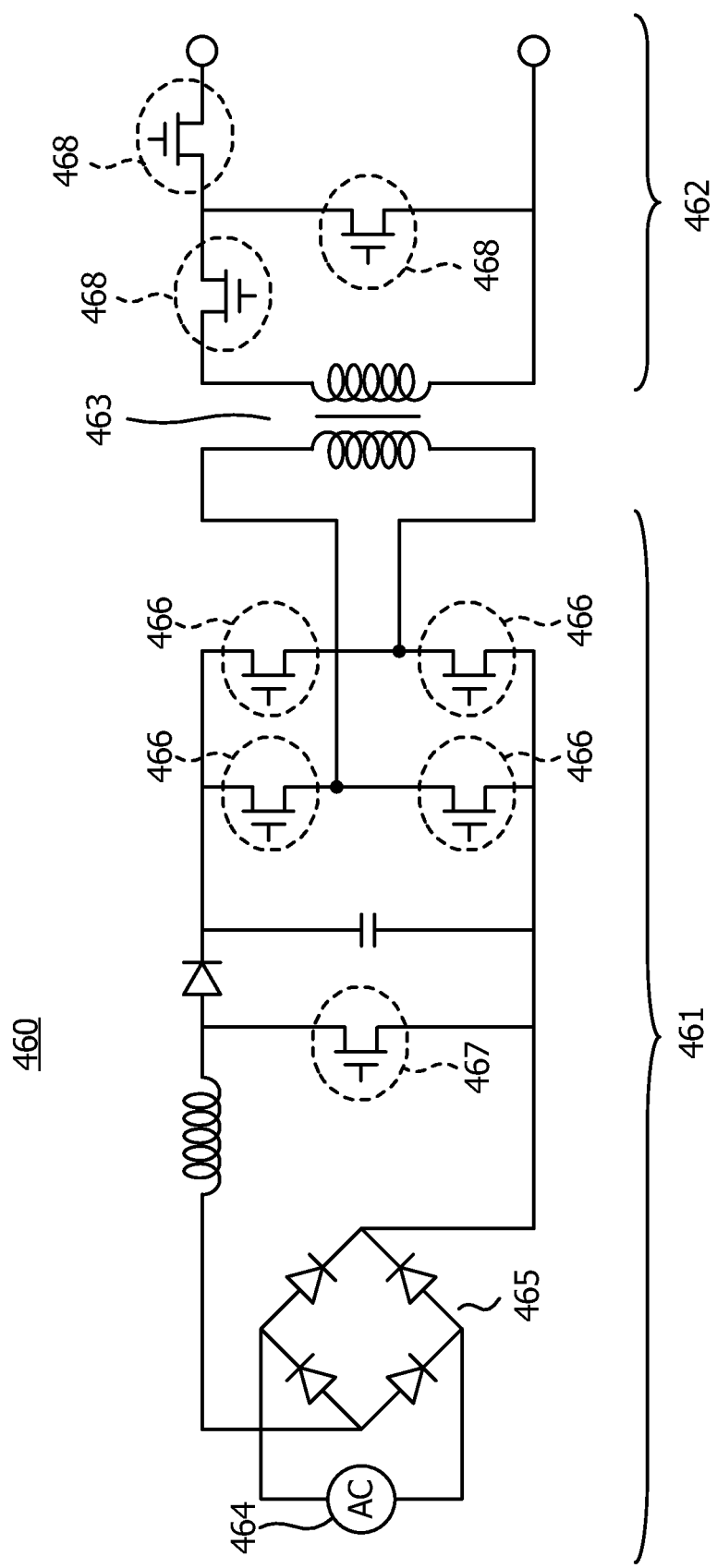
FIG. 16 is a circuit diagram of a power supply device according to a sixth embodiment.

First, a power supply device according to the embodiment is described based on FIG. 16. A power supply device 460 according to the embodiment includes a high-voltage primary-side circuit 461, a low-voltage secondary-side circuit 462, and a transformer 463 disposed between the high-voltage primary-side circuit 461 and the low-voltage secondary-side circuit 462. The primary-side circuit 461 includes an alternating-current power supply 464, a bridge rectifier circuit 465, a plurality of switching elements (in the example illustrated in FIG. 16, four) 466, and a switching element 467. The secondary-side circuit 462 includes a plurality of switching elements (in the example illustrated in FIG. 16, three) 468. In the example illustrated in FIG. 16, the semiconductor device according to any one of the first to fifth embodiments is used as each of the switching elements 466 and 467 of the primary-side circuit 461. Each of the switching elements 466 and 467 of the primary-side circuit 461 is preferably a normally-off semiconductor device. In addition, the switching elements 468 used in the secondary-side circuit 462 each use usual MISFET (metal insulator semiconductor field effect transistor) made of silicon.

Figure 17:
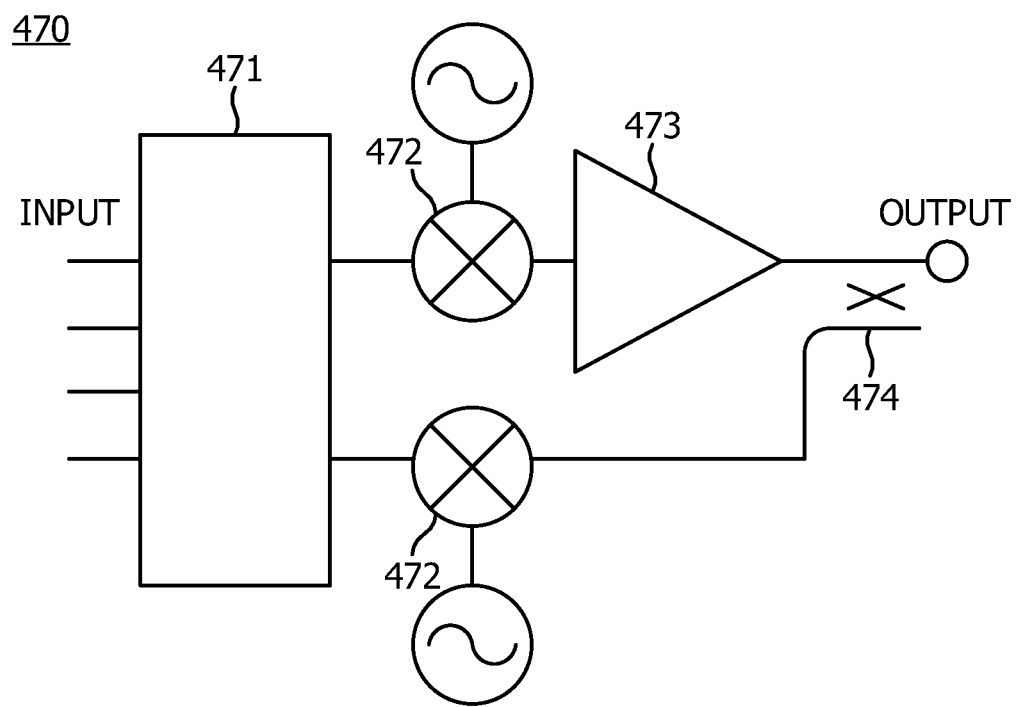
FIG. 17 is a structural diagram of a high-output amplifier according to a sixth embodiment.

Next, a high-frequency amplifier according to the embodiment is described based on FIG. 17. A high-frequency amplifier 470 according to the embodiment may be applied to, for example, a power amplifier for cellular phone base stations. The high-frequency amplifier 470 includes a digital pre-distortion circuit 471, a mixer 472, a power amplifier 473, and a directional coupler 474. The digital pre-distortion circuit 471 compensates for nonlinear distortion of an input signal. The mixer 472 mixes the input signal with compensated nonlinear distortion with an alternating-current signal. The power amplifier 473 amplifies the input signal mixed with the alternating-current signal. In an example illustrated in FIG. 17, the power amplifier 473 includes the semiconductor device according to any one of the first to fifth embodiments. The directional coupler 474 monitors the input signal and an output signal. In the circuit illustrated in FIG. 17, for example, by changing over a switch, an output signal may be mixed with an alternating-current signal by the mixer 472 and then sent to the digital pre-distortion circuit 471.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a buffer layer formed over a substrate;
    a first semiconductor layer formed over the buffer layer by using a compound semiconductor;
    a second semiconductor layer formed over the first semiconductor layer by using a compound semiconductor; and
    a gate electrode, a source electrode, and a drain electrode formed over the second semiconductor layer,
    wherein the first semiconductor layer contains an impurity element serving as an acceptor and an impurity element serving as a donor; and
    in the first semiconductor layer, an acceptor concentration of the impurity element serving as the acceptor is greater than a donor concentration of the impurity element serving as the donor; and
    the donor concentration is greater-than over equal to $5 \times 10^{16}$ cm$^{-3}$.

2. The semiconductor device according to claim 1,
    wherein the buffer layer contains an impurity element serving as an acceptor and an impurity element serving as a donor;
    in the buffer layer, the acceptor concentration is greater-than the donor concentration; and the donor concentration is greater-than over equal to $5 \times 10^{16}$ cm$^{-3}$.

3. The semiconductor device according to claim 1,
    wherein the position of the electronic level of the impurity element serving as the donor is within 0.3 eV from the lower end of a conduction band of the compound semiconductor containing the impurity element serving as the donor.

4. The semiconductor device according to claim 1, wherein the impurity element serving as the acceptor is C, and the impurity element serving as the donor is Si.

5. The semiconductor device according to claim 1, wherein the donor concentration of the impurity element increases from the substrate side to the second semiconductor layer side.

6. The semiconductor device according to claim 1, wherein the buffer layer, the first semiconductor layer, and the second semiconductor layer are made of nitride semiconductors.

7. The semiconductor device according to claim 1, wherein the donor concentration is greater-than over equal to the acceptor concentration divided by 5.

8. A semiconductor device comprising:
a buffer layer formed over a substrate;
a semiconductor buffer layer formed over the buffer layer by using a compound semiconductor;
a first semiconductor layer formed over the semiconductor buffer layer by using a compound semiconductor;
a second semiconductor layer formed over the first semiconductor layer by using a compound semiconductor; and
a gate electrode, a source electrode, and a drain electrode formed over the second semiconductor layer,
wherein the semiconductor buffer layer contains an impurity element serving as an acceptor and an impurity element serving as a donor; and
in the semiconductor buffer layer, an acceptor concentration of the impurity element serving as the acceptor is greater-than a donor concentration of the impurity element serving as the donor; and
the donor concentration is greater-than over equal to $5 \times 10^{16}$ cm$^{-3}$.

9. The semiconductor device according to claim 8, wherein in the first semiconductor layer, the acceptor concentration is less-than $5 \times 10^{16}$ cm$^{-3}$.

10. The semiconductor device according to claim 8, wherein the semiconductor buffer layer and the first semiconductor layer are made of semiconductor materials having the same composition.

11. The semiconductor device according to claim 8, wherein the buffer layer contains an impurity element serving as an acceptor and an impurity element serving as a donor;
in the buffer layer, the acceptor concentration is greater-than the donor concentration; and the donor concentration is greater-than over equal to $5 \times 10^{16}$ cm$^{-3}$.

12. The semiconductor device according to claim 8, wherein the position of the electronic level of the impurity element serving as the donor is within 0.3 eV from the lower end of a conduction band of the compound semiconductor containing the impurity element serving as the donor.

13. The semiconductor device according to claim 8, wherein the impurity element serving as the acceptor is C, and the impurity element serving as the donor is Si.

14. The semiconductor device according to claim 8, wherein the donor concentration of the impurity element increases from the substrate side to the second semiconductor layer side.

15. The semiconductor device according to claim 8, wherein the buffer layer, the first semiconductor layer, and the second semiconductor layer are made of nitride semiconductors.

16. The semiconductor device according to claim 8, wherein the donor concentration is greater-than over equal to the acceptor concentration divided by 5.

17. A method for manufacturing a device comprising:
forming a buffer layer over a substrate;
forming a first semiconductor layer over the buffer layer by using a compound semiconductor;
forming a second semiconductor layer over the first semiconductor layer by using a compound semiconductor; and
forming a gate electrode, a source electrode, and a drain electrode over the second semiconductor layer,
wherein in forming the first semiconductor layer, the first semiconductor layer is doped with an impurity element serving as a donor so that an acceptor concentration of an impurity element serving as an acceptor is greater-than a donor concentration of the impurity element serving as the donor; and the donor concentration is greater-than over equal to $5 \times 10^{16}$ cm$^{-3}$.

18. A method for manufacturing a device comprising:
forming a buffer layer over a substrate;
forming a semiconductor buffer layer over the buffer layer by using a compound semiconductor;
forming a first semiconductor layer over the semiconductor buffer layer by using a compound semiconductor;
forming a second semiconductor layer over the first semiconductor layer by using a compound semiconductor; and
forming a gate electrode, a source electrode, and a drain electrode over the second semiconductor layer,
wherein in forming the semiconductor buffer layer, the semiconductor buffer layer is doped with an impurity element serving as a donor
so that an acceptor concentration of an impurity element serving as an acceptor is greater-than a donor concentration of the impurity element serving as the donor; and the donor concentration is greater-than over equal to $5 \times 10^{16}$ cm$^{-3}$.

* * * * *